(12) United States Patent
Kuretake

(10) Patent No.: US 9,202,995 B2
(45) Date of Patent: Dec. 1, 2015

(54) LIGHT-EMITTING ELEMENT, METHOD FOR PRODUCING SAME AND LIGHT-EMITTING DEVICE

(71) Applicant: MURATA MANUFACTURING CO., LTD., Nagaokakyo-Shi, Kyoto-fu (JP)

(72) Inventor: Satoshi Kuretake, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/255,059

(22) Filed: Apr. 17, 2014

(65) Prior Publication Data

US 2014/0209954 A1    Jul. 31, 2014

Related U.S. Application Data

(63) Continuation of application No. PCT/JP2012/074525, filed on Sep. 25, 2012.

(30) Foreign Application Priority Data

Oct. 18, 2011  (JP) .................................. 2011-228925
Jan. 12, 2012  (JP) .................................. 2012-004195

(51) Int. Cl.
*H01L 33/00*       (2010.01)
*H01L 29/18*       (2006.01)
(Continued)

(52) U.S. Cl.
CPC .............. *H01L 33/504* (2013.01); *B32B 18/00* (2013.01); *C01G 19/00* (2013.01); *C01G 25/006* (2013.01);
(Continued)

(58) Field of Classification Search
CPC ............................ H01L 33/502; H01L 33/504

USPC ................................ 257/88, 103; 250/361 R
See application file for complete search history.

(56) References Cited

U.S. PATENT DOCUMENTS 8,034,468 B2 * 10/2011 Hayashi ........................ 428/701
8,674,310 B2 *  3/2014 Kuretake et al. ........... 250/361 R
(Continued)

FOREIGN PATENT DOCUMENTS

JP    2006-155254 A    6/2006
JP    2007-016197 A    1/2007
(Continued)

OTHER PUBLICATIONS

A.M. Srivastava et al. On the Impurity Trapped Exciton Luminescence in La2Zr2O7:bi3, Journal of Luminescence, 1999, 81, p. 293-300.

(Continued)

*Primary Examiner* — Nicholas Tobergte
(74) *Attorney, Agent, or Firm* — Arent Fox LLP

(57) ABSTRACT

A light-emitting element that includes a first wavelength conversion unit and a second wavelength conversion unit. The first wavelength conversion unit includes a ceramic containing, as a primary component, a pyrochlore-type compound represented by $A^1B^1O_{w1}$. The second wavelength conversion unit includes a ceramic containing, as a primary component, a pyrochlore-type compound represented by $A^2B^2O_{w2}$. $A^1$ and $A^2$ each include at least one element selected from the group consisting of La, Y, Gd, Yb and Lu, and 0.001 mol % to 5 mol % of Bi. $B^1$ and $B^2$ each include at least one element selected from the group consisting of Sn, Zr and Hf. The content of La in $A^1$ is higher than the content of La in $A^2$. The contents of Y, Gd, and Lu in $A^2$ are higher than the contents of Y, Gd and Lu in $A^1$.

16 Claims, 5 Drawing Sheets

(51) Int. Cl.
*H01L 33/50* (2010.01)
*C09K 11/77* (2006.01)
*B32B 18/00* (2006.01)
*C04B 35/486* (2006.01)
*C01G 19/00* (2006.01)
*C01G 25/00* (2006.01)
*C01G 27/00* (2006.01)

(52) U.S. Cl.
CPC ............ *C01G 27/006* (2013.01); *C04B 35/486* (2013.01); *C09K 11/7701* (2013.01); *C09K 11/7769* (2013.01); *C01P 2002/52* (2013.01); *C01P 2002/72* (2013.01); *C01P 2006/60* (2013.01); *C04B 2235/3224* (2013.01); *C04B 2235/3225* (2013.01); *C04B 2235/3227* (2013.01); *C04B 2235/3293* (2013.01); *C04B 2235/3298* (2013.01); *C04B 2235/652* (2013.01); *C04B 2235/6582* (2013.01); *C04B 2235/6584* (2013.01); *C04B 2235/6586* (2013.01); *C04B 2235/6588* (2013.01); *C04B 2235/664* (2013.01); *C04B 2237/348* (2013.01); *C04B 2237/704* (2013.01); *H01L 33/502* (2013.01)

(56) References Cited

U.S. PATENT DOCUMENTS

2006/0288926 A1  12/2006  Kurata et al.
2010/0059777 A1   3/2010  Bechtel et al.

FOREIGN PATENT DOCUMENTS

JP    2010-512014 A    4/2010
JP    2011-102004 A    5/2011

OTHER PUBLICATIONS

A.M. Srivastava et al. on the Luminescence of BI3 in the Pyrochlore Y2Sn207, Materials Research Bulletin, 2002, 37, p. 745-751.
PCT/JP2012/074525 Written Opinion dated Oct. 18, 2012.
PCT/JP2012/074525 ISR dated Oct. 18, 2012.

* cited by examiner

LIGHT-EMITTING ELEMENT, METHOD FOR PRODUCING SAME AND LIGHT-EMITTING DEVICE

CROSS-REFERENCE TO RELATED APPLICATIONS

The present application is a continuation of International application No. PCT/JP2012/074525, filed Sep. 25, 2012, which claims priority to Japanese Patent Application No. 2011-228925, filed Oct. 18, 2011, and Japanese Patent Application No. 2012-004195, filed Jan. 12, 2012, the entire contents of each of which are incorporated herein by reference.

FIELD OF THE INVENTION

The present invention relates to a light-emitting element, a method for producing the same, and a light-emitting device.

BACKGROUND OF THE INVENTION

As a conventional white light source, a white light source, having a blue LED (light-emitting diode) and a wavelength conversion element including a phosphor and emitting white light which is mixed light of light emitted from the blue LED to penetrate through the phosphor and fluorescence from the phosphor, is known (for example, refer to Patent Document 1).
Patent Document 1: JP 2010-512014 W

SUMMARY OF THE INVENTION

However, in the white light source described in Patent Document 1, color tone of light emitted may vary depending on the variation or fluctuation in light-emitting characteristics of the blue LED. Further, a wavelength band of light emitted from the blue LED or the wavelength conversion element is narrow. Thus, excellent color rendering properties are hardly achieved by the white light source described in Patent Document 1.

In view of these problems, a light-emitting element which produces emission of light having a wide wavelength band is demanded.

It is a principal object of the present invention to provide a light-emitting element which produces emission of light having a wide wavelength band.

The light-emitting element according to the present invention includes a first wavelength conversion unit and a second wavelength conversion unit. The second wavelength conversion unit is disposed on the first wavelength conversion unit. The first wavelength conversion unit includes a ceramic containing, as a primary component, a pyrochlore-type compound represented by $A^1B^1O_{w1}$ in which $A^1$ includes at least one element selected from the group consisting of La, Y, Gd, Yb and Lu, and 0.001 mol % to 5 mol % of Bi, $B^1$ includes at least one element selected from the group consisting of Sn, Zr and Hf, and W1 is a positive number for maintaining electrical neutrality. The second wavelength conversion unit includes a ceramic containing, as a primary component, a pyrochlore-type compound represented by $A^2B^2O_{w2}$ in which $A^2$ includes at least one element selected from the group consisting of La, Y, Gd, Yb and Lu, and 0.001 mol % to 5 mol % of Bi, $B^2$ includes at least one element selected from the group consisting of Sn, Zr and Hf, and W2 is a positive number for maintaining electrical neutrality. The content of La in $A^1$ is higher than the content of La in $A^2$. The contents of Y, Gd, and Lu in $A^2$ are higher than the contents of Y, Gd, and Lu in $A^1$.

In a specific aspect of the light-emitting element according to the present invention, $A^1$ includes La and 0.001 mol % to 5 mol % of Bi. $B^1$ includes at least one element selected from the group consisting of Sn, Zr and Hf. $A^2$ includes at least one element selected from Gd and Y, and 0.001 mol % to 5 mol % of Bi. $B^2$ includes at least one element selected from Zr and Hf.

In another specific aspect of the light-emitting element according to the present invention, when the light-emitting element is irradiated with light having a wavelength of 360 nm, a color of mixed light of light emitted from the first wavelength conversion unit and light emitted from the second wavelength conversion unit is white.

In the present invention, the term "white" refers to a light source in which a distance duv between a chromaticity coordinate of the light source and an orbit of black-body radiation is 0.02 or less, and a temperature at the closest point on the orbit of black-body radiation, namely, a correlated color temperature is 3000 K to 10000 K in the CIE 1960 uv chromaticity diagram.

In another specific aspect of the light-emitting element according to the present invention, the light-emitting element further includes an interdiffusion layer provided between the first wavelength conversion unit and the second wavelength conversion unit.

In a method for producing a light-emitting element according to the present invention, a first ceramic green sheet including a first phosphor or a precursor thereof is formed. A second ceramic green sheet including a second phosphor or a precursor thereof is formed. The first ceramic green sheet and the second ceramic green sheet are laminated to prepare a laminate. By sintering the laminate, a sintering step of obtaining a light-emitting element having a first wavelength conversion unit formed from the first ceramic green sheet, and a second wavelength conversion unit formed from the second ceramic green sheet and joined to the first wavelength conversion unit, is performed.

In a specific aspect of the method for producing a light-emitting element according to the present invention, the laminate is sintered such that an interdiffusion layer is formed between the first wavelength conversion unit and the second wavelength conversion unit in the sintering step. In this case, the light-emitting element may include a third green sheet, having a composition intermediate between the composition of the first green sheet and that of the second green sheet, between the first green sheet and the second green sheet for the purpose of alleviating the occurrence of stress due to sintering, and for this case, the operation and effect described below are not affected. Further, in this case, the incidence of cracks can be suppressed.

In another specific aspect of the method for producing a light-emitting element according to the present invention, the first phosphor includes a ceramic containing, as a primary component, a pyrochlore-type compound represented by $A^1B^1O_{w1}$ in which $A^1$ includes at least one element selected from the group consisting of La, Y, Gd, Yb and Lu, and 0.001 mol % to 5 mol % of Bi, $B^1$ includes at least one element selected from the group consisting of Sn, Zr and Hf, and W1 is a positive number for maintaining electrical neutrality. The second phosphor includes a ceramic containing, as a primary component, a pyrochlore-type compound represented by $A^2B^2O_{w2}$ in which $A^2$ includes at least one element selected from the group consisting of La, Y, Gd, Yb and Lu, and 0.001 mol % to 5 mol % of Bi, $B^2$ includes at least one element selected from the group consisting of Sn, Zr and Hf, and W2 is a positive number for maintaining electrical neutrality. The content of La in $A^1$ is higher than the content of La in $A^2$. The contents of Y, Gd, and Lu in $A^2$ are higher than the contents of Y, Gd, and Lu in $A^1$.

A light-emitting device of the present invention includes the light-emitting element, and a light source which emits excitation light for the light-emitting element to the light-emitting element.

In accordance with the present invention, it is possible to provide a light-emitting element which produces emission of light having a wide wavelength band.

DETAILED DESCRIPTION OF THE INVENTION

Figure 1:
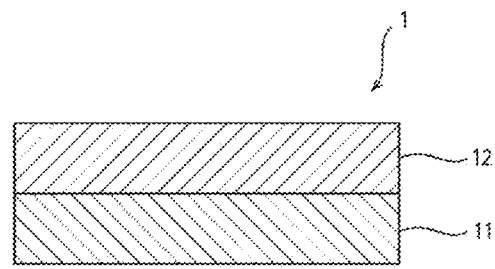
FIG. 1 is a schematic sectional view of a light-emitting element according to one embodiment of the present invention.

Hereinafter, one preferred embodiment of the present invention will be described. However, the following embodiment is merely exemplification. The present invention is not limited to the following embodiment at all.

Drawings referred to in the embodiment are schematically drawn, and a dimensional ratio between objects drawn in the drawings may be different from a real dimensional ratio between objects. A concrete dimensional ratio between objects is to be determined in consideration of the following description.

A light-emitting element 1 shown in FIG. 1 is an element which emits light having a longer wavelength than excitation light when the excitation light enters the light-emitting element 1.

The light-emitting element 1 has a first wavelength conversion unit 11 and a second wavelength conversion unit 12. The second wavelength conversion unit 12 is disposed on the first wavelength conversion unit 11. That is, the first wavelength conversion unit 11 and the second wavelength conversion unit 12 are laminated.

The first wavelength conversion unit 11 and the second wavelength conversion unit 12 are joined to each other. An interdiffusion layer not shown is provided between the first wavelength conversion unit 11 and the second wavelength conversion unit 12. The interdiffusion layer is a layer which is formed by interdiffusion between a component of the first wavelength conversion unit 11 and a component of the second wavelength conversion unit 12. The first wavelength conversion unit 11 and the second wavelength conversion unit 12 are firmly joined to each other by the interdiffusion layer. Further, the interdiffusion layer is provided to thereby enable to slow the change in refractive index between the first wavelength conversion unit 11 and the second wavelength conversion unit 12. Therefore, a reflection rate of light at an interface between the first wavelength conversion unit 11 and the second wavelength conversion unit 12 can be reduced. Consequently, emission efficiency of light can be increased.

The first wavelength conversion unit 11 includes a first phosphor including a ceramic containing, as a primary component, a pyrochlore-type compound represented by $A^1B^1O_{w1}$ in which $A^1$ includes at least one element selected from the group consisting of La, Y, Gd, Yb and Lu, and 0.001 mol % to 5 mol % of Bi, $B^1$ includes at least one element selected from the group consisting of Sn, Zr and Hf, and W1 is a positive number for maintaining electrical neutrality.

In the ceramic containing, as a primary component, a pyrochlore-type compound represented by $A^1B^1O_{w1}$, a molar ratio ($A^1$:$B^1$) is not strictly limited to 1:1. In the present invention, the ceramic, which contains a pyrochlore-type compound represented by $A^1B^1O_{w1}$ as a primary component, includes a ceramic in which the molar ratio ($A^1/B^1$) is 0.95 to 1.05.

On the other hand, the second wavelength conversion unit 12 includes a second phosphor including a ceramic containing, as a primary component, a pyrochlore-type compound represented by $A^2B^2O_{w2}$ in which $A^2$ includes at least one element selected from the group consisting of La, Y, Gd, Yb and Lu, and 0.001 mol % to 5 mol % of Bi, $B^2$ includes at least one element selected from the group consisting of Sn, Zr and Hf, and W2 is a positive number for maintaining electrical neutrality.

In the ceramic containing, as a primary component, a pyrochlore-type compound represented by $A^2B^2O_{w2}$, a molar ratio ($A^2$:$B^2$) is not strictly limited to 1:1. In the present invention, the ceramic, which contains a pyrochlore-type compound represented by $A^2B^2O_{w2}$ as a primary component, includes a ceramic in which the molar ratio ($A^2/B^2$) is 0.95 to 1.05.

Herein, W2 may be the same as W1, or may be different from W1. W1 and W2 can be each set to, for example, 3.5. That is, specific examples of $A^1B^1O_{w1}$ include $A^1_2B^1_2O_7$. Specific examples of $A^2B^2O_{w2}$ include $A^2_2B^2_2O_7$.

The first and the second phosphors are preferably formed by heat treating the ceramic represented by $A^1B^1O^{w1}$ or $A^2B^2O^{w2}$ in a reduction atmosphere.

Herein, the first and the second phosphors including the ceramic represented by $A^1B^1O_{w1}$ or $A^2B^2O_{w2}$ produce emission of light having a wide wavelength band as compared with, for example, a typical phosphor for white LEDs, such as a Ga:YAG phosphor. Further, in the present embodiment, the content of La in $A^1$ is higher than the content of La in $A^2$. The contents of Y, Gd, and Lu in $A^2$ are higher than the contents of Y, Gd, and Lu in $A^1$. Thus, the light emitted from the first phosphor including the ceramic represented by $A^1B^1O_{w1}$ includes emitted light having a wide band in which a center emission wavelength is located on a relatively long wavelength side, and the light emitted from the second phosphor including the ceramic represented by $A^2B^2O_{w2}$ includes emitted light having a wide band in which a center emission wavelength is located on a relatively short wavelength side.

Accordingly, a wavelength band of mixed light of light emitted from the first phosphor, having a wide band, and light emitted from the second phosphor, having a wide band, is wide. That is, the light-emitting element 1 produces emission of light having a wide wavelength band. Accordingly, excellent color rendering properties can be realized. Further, a light-emitting element 1 emitting white light can be obtained. Specifically, when the light-emitting element is irradiated with light having a wavelength of 360 nm, a color of mixed light of light emitted from the first wavelength conversion unit 11 and light emitted from the second wavelength conversion unit 12 is preferably white.

The first phosphor including the ceramic represented by $A^1B^1O_{w1}$ is preferably a phosphor which emits light having a center emission wavelength of 550 nm to 700 nm, and more preferably a phosphor which emits light having a center emission wavelength of 600 nm to 700 nm. The second phosphor including the ceramic represented by $A^2B^2O_{w2}$ is preferably a phosphor which emits light having a center emission wavelength of 400 nm to 550 nm, and more preferably a phosphor which emits light having a center emission wavelength of 400 nm to 500 nm.

In the first phosphor, $A^1$ preferably includes La and 0.001 mol % to 5 mol % of Bi. Further, $B^1$ preferably includes at least one element selected from Zr, Sn and Hf.

In the second phosphor, $A^2$ preferably includes at least one element selected from Gd and Y, and 0.001 mol % to 5 mol % of Bi. Further, $B^2$ preferably includes at least one element selected from Hf and Zr.

Herein, a crystal system of the principal component of the ceramic represented by $A^1B^1O_{w1}$ or $A^2B^2O_{w2}$ may be a cubical crystal.

The ceramic represented by $A^1B^1O_{w1}$ or $A^2B^2O_{w2}$ may include impurities which are inevitably mixed (hereinafter, referred to as "inevitable impurities") besides $A^1$ or $A^2$, $B^1$ or $B^2$ and O components. Specific examples of the inevitable impurities include $SiO_2$, $B_2O_3$ and $Al_2O_3$.

Next, one example of a method for producing the light-emitting element 1 will be described.

First, a first ceramic green sheet including a first phosphor including the ceramic represented by $A^1B^1O_{w1}$ or the precursor thereof is prepared. Specifically, a first paste including the first phosphor is prepared. Next, the first paste is applied onto a resin sheet, for example, by a screen printing method to thereby prepare the first ceramic green sheet. Herein, the precursor of the first phosphor refers to a substance which can serve as the first phosphor by being subjected to heat treatment or the like.

Similarly, a second ceramic green sheet including the second phosphor including the ceramic represented by $A^2B^2O_{w2}$ or the precursor thereof is prepared. Herein, the precursor of the second phosphor refers to a substance which can serve as the second phosphor by being subjected to heat treatment or the like.

Next, the first ceramic green sheet and the second ceramic green sheet are laminated. For example, a plurality of the first ceramic green sheets may be laminated, and then a plurality of the second ceramic green sheets may be laminated thereon. The number of the first ceramic green sheets laminated and the number of the second ceramic green sheets laminated can be appropriately set depending on the thickness of each of the ceramic green sheets and the thickness of a wavelength conversion unit to be obtained. The resulting laminate may be pressed if necessary.

Next, the laminate is sintered (sintering step). Sintering of the laminate may be performed, for example, in an atmosphere including oxygen. A sintering temperature (maximum temperature) can be set to, for example, about 1500° C. to 1800° C. A retention time of the sintering temperature (maximum temperature) can be set to, for example, about 5 to 100 hours.

Thereafter, a sintered body is subjected to heat treatment in a reduction atmosphere (heat treatment under reducing conditions). This heat treatment step may be performed, for example, in an atmosphere of $H_2/H_2O$. The heat treatment temperature (maximum temperature) of the sintered body is, for example, preferably 800° C. to 1200° C., and more preferably 900° C. to 1100° C. Further, a retention time of the heat treatment temperature (maximum temperature) of the sintered body can be set to, for example, about 1 to 100 hours.

By the above-mentioned steps, it is possible to complete a light-emitting element 1 which has a first wavelength conversion unit 11 formed from at least one first ceramic green sheet, and a second wavelength conversion unit 12 formed from at least one second ceramic green sheet and joined to the first wavelength conversion unit 11.

In the sintering step, a laminate is preferably sintered under the conditions in which an interdiffusion layer is formed between the first wavelength conversion unit 11 and the second wavelength conversion unit 12.

By the way, it is considered that a light-emitting element is prepared by separately preparing a plurality of wavelength conversion units, and bonding these units by use of glass, a resin adhesive or the like. However, in this case, emission efficiency of light is decreased due to reflection of light at an interface between the wavelength conversion unit and the adhesive layer. When the total reflection takes place at the interface between the wavelength conversion unit and the adhesive layer, light extraction efficiency tends to be further decreased since light is confined within the wavelength conversion layer.

In contrast, in the present embodiment, the light-emitting element 1, which includes the first wavelength conversion unit 11 and the second wavelength conversion unit 12 respectively joined to each other, is prepared by sintering the laminate in which the first ceramic green sheet and the second ceramic green sheet are laminated. Therefore, it is not necessary to provide an adhesive layer between the first wavelength conversion unit 11 and the second wavelength conversion unit 12. Therefore, it is possible to suppress reflection or confinement of light at an interface between the first wavelength conversion unit 11 and the second wavelength conversion unit 12. Accordingly, high light extraction efficiency can be realized.

Furthermore, when the interdiffusion layer is provided, the refractive index varies gradually in a thickness direction between the first wavelength conversion unit 11 and the second wavelength conversion unit 12. Accordingly, the reflection of light can be more effectively suppressed.

Figure 8:
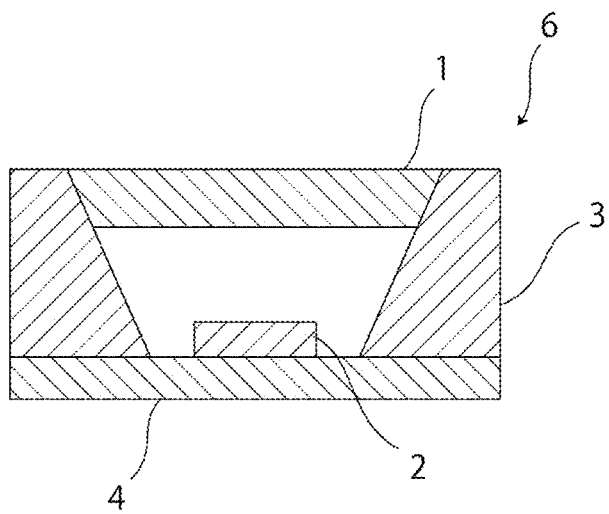
FIG. 8 is a schematic sectional view of a first light-emitting device.

A light-emitting device can be formed by combining the light-emitting element 1 with a light source. FIG. 8 is a schematic sectional view of a first light-emitting device 6 including the light-emitting element 1. The first light-emitting device 6 includes the light-emitting element 1 and a light source 2. The light-emitting element 1 is disposed on a substrate 4. The light source 2 is arranged away from the light-emitting element 1. The light source 2 emits excitation light for the light-emitting element 1 to the light-emitting element 1. Examples of the light source 2 include an LED. The light-emitting element 1 emits light by receiving excitation light from the light source 2. In the first light-emitting device 6, a part of the excitation light from the light source 2 is reflected by a reflector 3 and reaches the light-emitting element 1.

The surface of the light-emitting element 1 may be processed into a lens shape or a moth-eye structure by machine processing such as polishing or laser ablation processing from the viewpoint of improvement in light extraction efficiency or adjustment of directivity. Further, from the same viewpoint, other material including a resin or glass, which is processed into a lens shape or a moth-eye structure by machine processing such as polishing or laser ablation processing, may be disposed on the surface of the light-emitting element 1.

Figure 9:
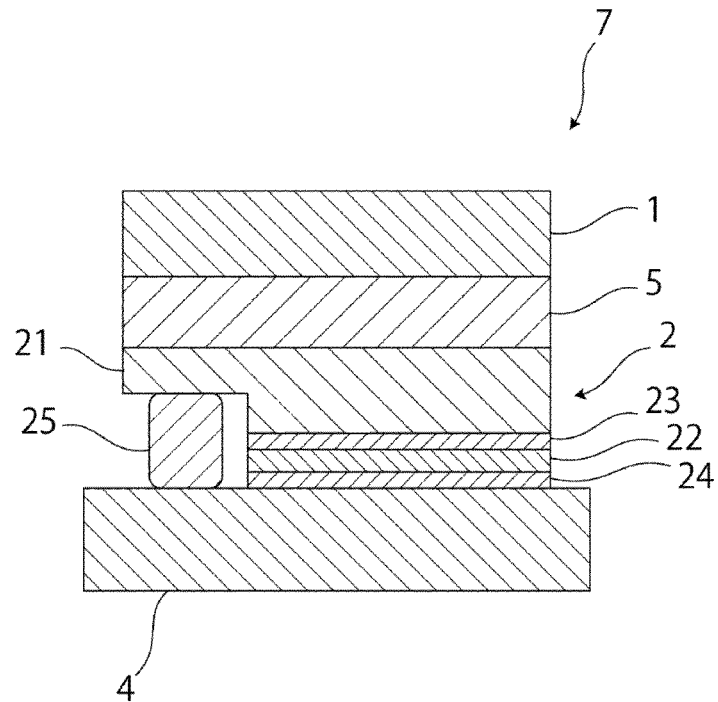
FIG. 9 is a schematic sectional view of a second light-emitting device.

FIG. 9 is a schematic sectional view of a second light-emitting device 7. In the second light-emitting device 7, the light-emitting element 1 and the light source 2 are connected to each other with an epitaxial wafer 5 interposed therebetween. The light-emitting element 1 and the epitaxial wafer 5 can be connected to each other by, for example, a method of using an adhesive or a method of utilizing heat diffusion. The epitaxial wafer 5 is formed by, for example, sapphire, silicon carbide, silicon, aluminum nitride, or gallium nitride. In the light source 2 of the second light-emitting device 7, a first electrode 24, a p-type layer 22, an emissive layer 23, and an n-type layer 21 are located in this order. The p-type layer 22 is electrically connected to the first electrode 24. The n-type layer 21 is electrically connected to the second electrode 25.

Figure 10:
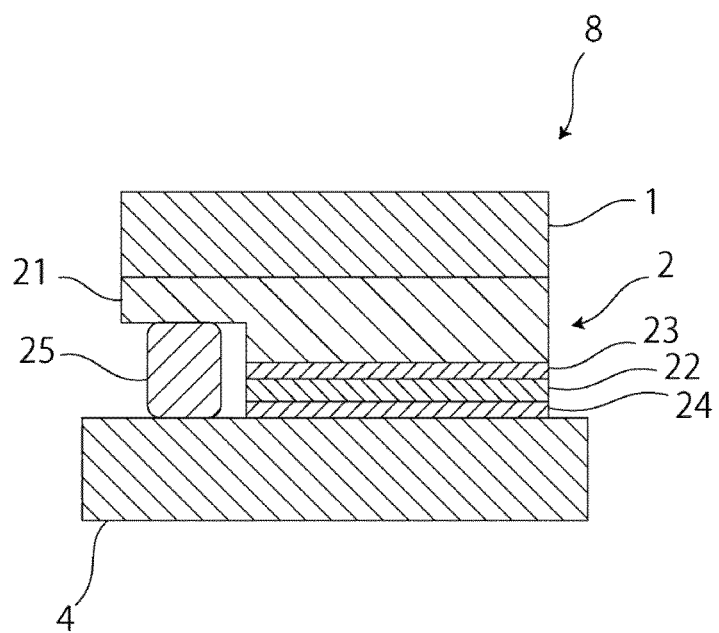
FIG. 10 is a schematic sectional view of a third light-emitting device.

FIG. 10 is a schematic sectional view of a third light-emitting device 8. In the third light-emitting device 8, the light-emitting element 1 and the light source 2 are directly connected to each other without the epitaxial wafer 5 interposed therebetween.

Figure 11:
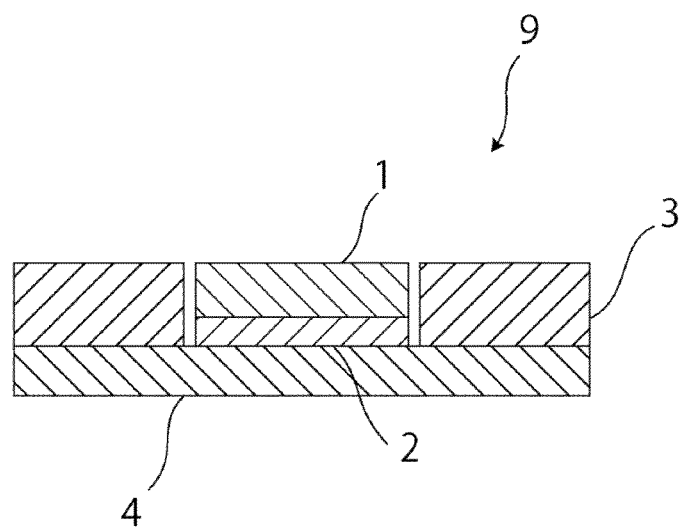
FIG. 11 is a schematic sectional view of a fourth light-emitting device.

FIG. 11 is a schematic sectional view of a fourth light-emitting device 9. In the fourth light-emitting device 9, the light-emitting element 1 and the light source 2 are in contact with each other without spacing.

Hereinafter, the present invention will be described in more detail based on specific Examples, but the present invention is not limited to the following Examples, and variations may be appropriately made without changing the gist of the present invention.

Example 1

First, high purity La (OH)$_3$, Gd$_2$O$_3$, Y$_2$O$_3$, ZrO$_2$, HfO$_2$, SnO$_2$ and Bi$_2$O$_3$ were prepared as raw materials. These raw materials were weighed so as to have composition A shown in Table 1 below, and wet-mixed in a ball mill for 20 hours. The resulting mixture was dried, and then calcined at 1300° C. for 3 hours to obtain a calcined product. The calcined product was put into a ball mill together with water, an organic dispersant and an organic binder, and wet-pulverized for 12 hours. Next, the resulting pulverized product was shaped into a green sheet of 60 μm in thickness. The resulting green sheet was cut out into a piece of 10 mm square, and 15 pieces were overlaid and pressed at a pressure of 2 t/cm$^2$ to prepare a first compact of 10 mm square, having a thickness of about 0.8 mm.

A second compact was obtained in the same manner except for weighing so as to have composition B shown in Table 1 below.

TABLE 1

| | Compositional Ratio | | | | | | |
| | Site A | | | | Site B | | |
| Composition | La | Gd | Y | Bi | Zr | Hf | Sn |
| A | 0.995 | | | 0.005 | 1.000 | | |
| B | | 0.995 | | 0.005 | | 1.000 | |
| C | 0.995 | | | 0.005 | | 0.800 | 0.200 |
| D | | 0.500 | 0.500 | 0.005 | 0.500 | 0.500 | |

Next, each of the first compact and the second compact was fired in an atmosphere having an oxygen concentration of about 98% at 1700° C. for 20 hours. The resulting sintered body was heat-treated in a reduction atmosphere of H$_2$/H$_2$O (oxygen partial pressure: 1×10$^{-15}$ MPa) at 900° C. for 3 hours. Thereafter, both surfaces of each sample were subjected to mirror polishing to adjust the thickness to 0.5 mm, and thus a first sample and a second sample were obtained. The results of XRD analysis of the first sample and the second sample are shown in FIG. 2 and FIG. 3.

Figure 2:
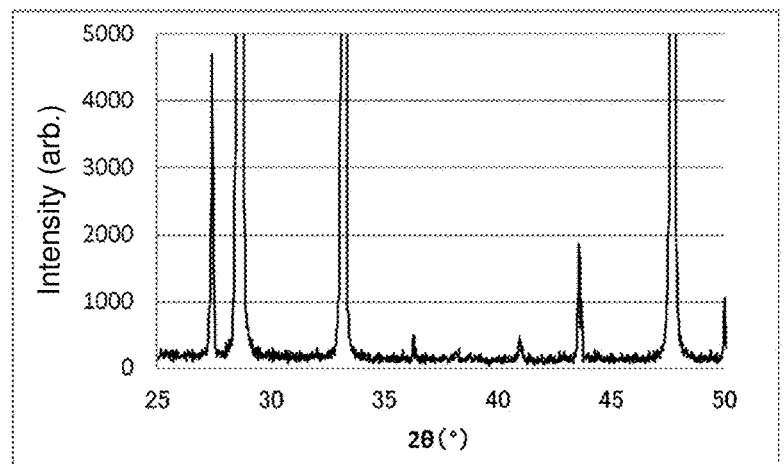
FIG. 2 is a graph showing the XRD analysis results of a first sample.
Figure 3:
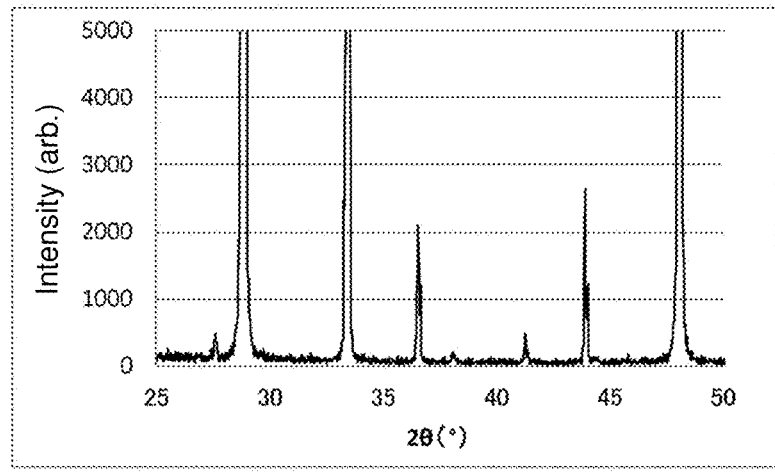
FIG. 3 is a graph showing the XRD analysis results of a second sample.

It is found from the results shown in FIG. 2 and FIG. 3 that the first sample includes a compound having a pyrochlore structure having a composition represented by La$_2$Zr$_2$O$_7$. It is also found that the second sample includes a compound having a pyrochlore structure having a composition represented by Gd$_2$Hf$_2$O$_7$.

Next, another first compact and another second compact, which were separate from the compacts used in preparing the first sample and the second sample, were laminated, and the resulting laminate was pressed at a pressure of 2 t/cm$^2$ to obtain a third compact of 10 mm square, having a thickness of about 1.5 mm.

Next, the third compact was fired in an atmosphere having an oxygen concentration of about 98% at 1700° C. for 20 hours. The resulting sintered body was heat-treated in a reduction atmosphere of H$_2$/H$_2$O (oxygen partial pressure: 1×10$^{-15}$ MPa) at 900° C. for 3 hours. Thereafter, both surfaces of the sintered body were subjected to mirror polishing to obtain a laminated light-emitting element (sample 3) having a thickness of 1.0 mm.

Next, element mapping analysis by WDX on the vicinity of a joint interface between the first compact and the second compact of sample 3 was performed. The results are shown in FIG. 4 and FIG. 5.

Figure 4:
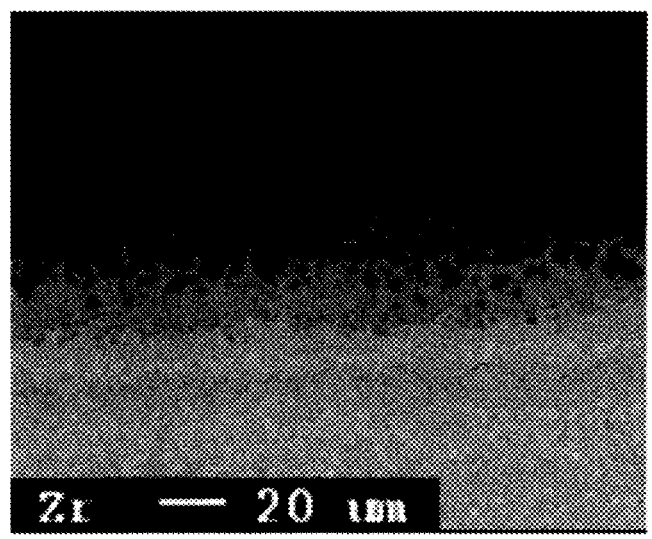
FIG. 4 is a photograph showing the result of element (Zr) mapping analysis by WDX on the vicinity of a joint interface between a first compact and a second compact of a sample 3.
Figure 5:
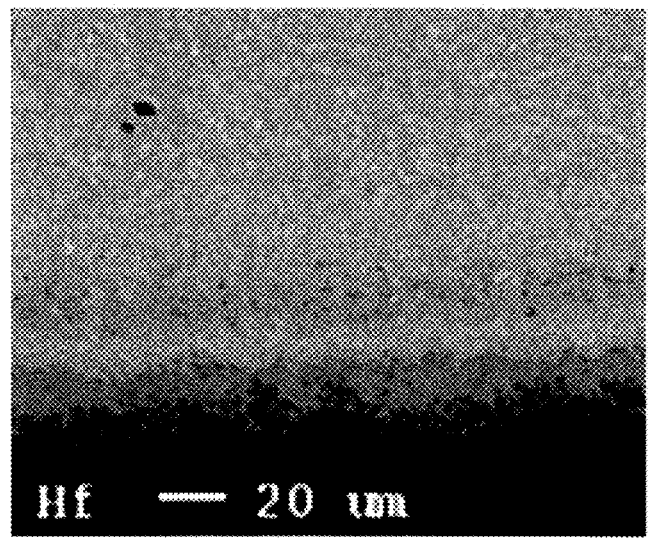
FIG. 5 is a photograph showing the result of element (Hf) mapping analysis by WDX on the vicinity of the joint interface between the first compact and the second compact of the sample 3.

It is found from the results shown in FIG. 4 and FIG. 5 that an interdiffusion layer having a thickness of about slightly less than 100 μm is formed at the interface.

Figure 6:
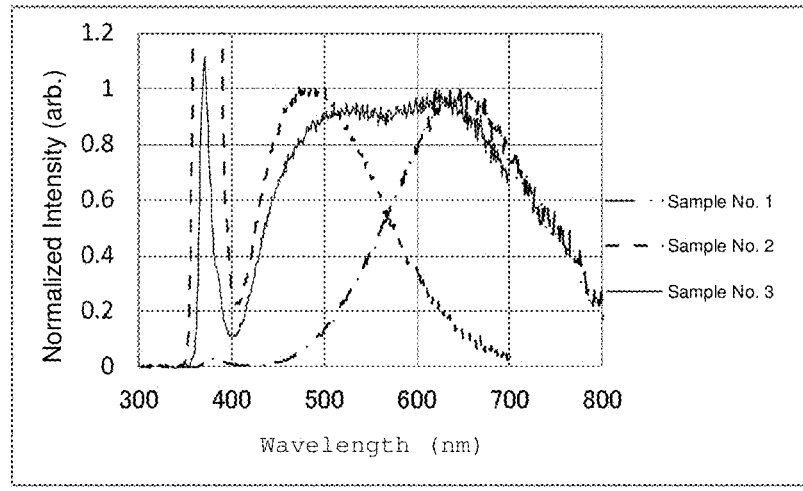
FIG. 6 is a graph showing an emission spectrum of each of the first to the third samples.

On each of the first sample to the third sample prepared, spectrofluorometric measurement at the time of irradiation with ultraviolet rays having a wavelength of 360 nm was conducted using a multichannel analyzer (PMA-12) manufactured by Hamamatsu Photonics K.K. Emission spectra of the first sample to the third sample are shown in FIG. 6, respectively. It is found from the results shown in FIG. 6 that emission of light having a wide band is obtained from the third sample according to the present invention.

Further, in the first sample, orange-colored emission, specifically, emission in which the correlated color temperature was 2100 K and the duv was 0.008 was observed. On the other hand, in the second sample, blue-colored emission, specifically, emission in which the correlated color temperature was 11800 K (reference value) and the duv was 0.037 was observed. Further, in the third sample, white-colored emission, specifically, emission in which the correlated color temperature was 4800 K and the duv was 0.005 was observed.

Herein, the term "correlated color temperature" refers to a temperature of a black body at a point on an orbit of black-body radiation, the point being located at a position closest to a chromaticity coordinate of light emission in the CIE 1960 uv chromaticity diagram, and the "duv" represents a distance therebetween. In addition, since JIS standard Z 8725 (1999) and 10 for composition B, was prepared in the same manner and was defined as sample 8. The correlated color temperature (K), the duv and the general color rendering index of each of samples 7 and 8 are shown in Table 2.

TABLE 2

|  | Correlated Color Temperature | duv | General Color Rendering Index (Ra) | R9 | R10 | R11 | R12 | R13 | R14 | R15 |
|---|---|---|---|---|---|---|---|---|---|---|
| Sample 3 | 4800 K | 0.005 | 97 | 96 | 94 | 95 | 97 | 98 | 98 | 99 |
| Sample 6 | 4300 K | 0.013 | 94 | 89 | 91 | 87 | 89 | 94 | 98 | 94 |
| Sample 7 | 5800 K | 0.007 | 96 | 93 | 96 | 93 | 98 | 97 | 97 | 97 |
| Sample 8 | 2800 K | 0.003 | 99 | 97 | 98 | 98 | 97 | 99 | 100 | 99 | specifies that emission of light allowed to be represented in terms of the correlated color temperature is emission of light in which the duv is 0.02 or less, the correlated color temperature of the second sample is shown as a reference value.

In Table 2 are shown the results of general color rendering indexes Ra and special color rendering indexes R9 to R15 determined from the emission spectrum of the third sample according to JIS Z 8726.

Herein, the term "color rendering evaluation index" is an index indicating how faithfully a color of an object obtained in irradiating the object with light of a reference light source is reproduced, and the index closer to 100 is determined to have better color rendering properties. In addition, the term "general color rendering index" indicates an average value of color rendering evaluation indexes in test colors No. 1 to No. 8 specified by JIS Z 8726, and the term "special color rendering index" indicates color rendering evaluation indexes of test colors No. 9 to No. 15.

It is found from the results shown in Table 2 to achieve so extremely excellent color rendering properties that almost color rendering evaluation indexes are 95 or more.

Example 2

A sintered substrate of 0.5 mm in thickness (sample 4) having composition C, a sintered substrate of 0.5 mm in thickness (sample 5) having composition D, and a laminated light-emitting element of 1.0 mm in thickness (sample 6), formed by laminating/sintering composition C and composition D, were prepared by the same method as in Example 1 except for preparing high purity La(OH)$_3$, Gd$_2$O$_3$, Y$_2$O$_3$, ZrO$_2$, HfO$_2$, SnO$_2$ and Bi$_2$O$_3$ as raw materials, and weighing these raw materials so as to have composition C or D shown in Table 1.

Figure 7:
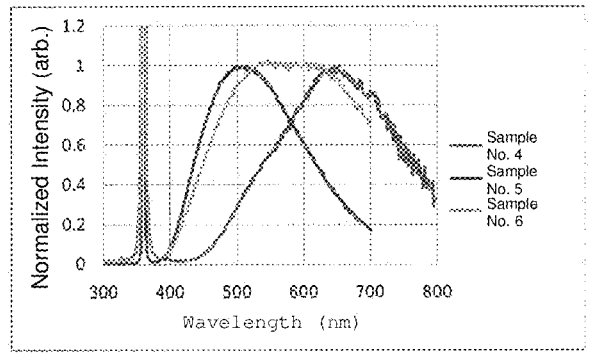
FIG. 7 is a graph showing an emission spectrum of each of fourth to sixth samples.

On the fourth sample to the sixth sample prepared, spectrofluorometric measurement was conducted in the same manner as in Example 1, and emission spectra thereof are shown in FIG. 7.

It is found from the results shown in FIG. 7 that emission of light having a wide band is obtained from the sixth sample according to the present invention. The correlated color temperature (K), the duv and the general color rendering index of sample 6 are shown in Table 2.

Example 3

A new laminated light-emitting element was prepared by the same method as in Example 1 except for changing the number of green sheets laminated in Example 1 to 10 for composition A and 20 for composition B, and was defined as sample 7. A laminated light-emitting element, in which the number of green sheets laminated was 20 for composition A It is found from the results shown in Table 2 that the present invention provides a light source in which the color rendering properties are as extremely excellent as the color rendering evaluation index is almost 95 or more in a wide color temperature range of a correlated color temperature of 2800 K to 5800 K.

Comparative Example 1

A sintered substrate of 0.5 mm in thickness, having composition A, and a sintered substrate of 0.5 mm in thickness, having composition B, were prepared by the same method as in Example 1, and these substrates were bonded to each other with a transparent epoxy resin to prepare comparative sample 1 of 10 mm square, having a thickness of 1.0 mm.

The amount of light emitted of comparative sample 1 was compared with that of the third sample. The evaluation method of this comparison will be described below.

First, a UV-LED chip having a wavelength of 360 nm is prepared, and a sample is placed on the chip and irradiated with light of the UV-LED in this state.

All light emitted from the front surface of the sample is taken into an integrating sphere, and the emission spectrum intensity of the light is measured with a multichannel analyzer (PMA-12) manufactured by Hamamatsu Photonics K.K.

The resulting emission spectrum is integrated with respect to a wavelength within a visible light region of 400 nm to 700 nm to define the integrated value as the emission intensity.

The measurement results of the amounts of light emitted of sample 3 and comparative sample 1 are shown in Table 3.

TABLE 3

|  | Integrated Value of Amount of Light Emitted with Respect to Wavelength (arb.) |
|---|---|
| Sample 3 | 100 |
| Comparative Sample 1 | 65 |

It has been found from the results shown in Table 3 that the amount of light emitted of sample 3 is larger than that of comparative sample 1. Accordingly, it has also been found that when a plurality of sintered substrates are used as the wavelength conversion layer, the wavelength conversion layer in which the substrates are joined to one another by sintering can more enhance the light extraction efficiency toward a front side than the wavelength conversion layer in which the substrates are bonded to one another with an adhesive.

DESCRIPTION OF REFERENCE SYMBOLS

1 Light-emitting element
11 First wavelength conversion unit
12 Second wavelength conversion unit
2 Light source
21 n-Type layer
22 p-Type layer
23 Emissive layer
24 First electrode
25 Second electrode
3 Reflector
4 Substrate
5 Epitaxial wafer
6 First light-emitting device
7 Second light-emitting device
8 Third emitting device
9 Fourth light-emitting device

The invention claimed is:

1. A light-emitting element comprising
a first wavelength conversion unit; and
a second wavelength conversion unit disposed on the first wavelength conversion unit, wherein
the first wavelength conversion unit includes a ceramic containing, as a primary component, a pyrochlore-type compound represented by $A^1B^1O_{w1}$ in which $A^1$ includes at least one element selected from the group consisting of La, Y, Gd, Yb and Lu, and 0.001 mol % to 5 mol % of Bi, $B^1$ includes at least one element selected from the group consisting of Sn, Zr and Hf, and W1 is a positive number to maintain electrical neutrality,
the second wavelength conversion unit includes a ceramic containing, as a primary component, a pyrochlore-type compound represented by $A^2B^2O_{w2}$ in which $A^2$ includes at least one element selected from the group consisting of La, Y, Gd, Yb and Lu, and 0.001 mol % to 5 mol % of Bi, $B^2$ includes at least one element selected from the group consisting of Sn, Zr and Hf, and W2 is a positive number to maintain electrical neutrality, and
the content of La in $A^1$ is higher than the content of La in $A^2$ and
the contents of Y, Gd and Lu in $A^2$ are higher than the contents of Y, Gd and Lu in $A^1$.

2. The light-emitting element according to claim 1, wherein
$A^1$ includes La and 0.001 mol % to 5 mol % of Bi,
$B^1$ includes at least one element selected from the group consisting of Sn, Zr and Hf,
$A^2$ includes at least one element selected from Gd and Y, and 0.001 mol % to 5 mol % of Bi, and
$B^2$ includes at least one element selected from Zr and Hf.

3. The light-emitting element according to claim 1, wherein, when the light-emitting element is irradiated with light having a wavelength of 360 nm, a color of mixed light of first light emitted from the first wavelength conversion unit and second light emitted from the second wavelength conversion unit is white.

4. The light-emitting element according to claim 1, further comprising an interdiffusion layer between the first wavelength conversion unit and the second wavelength conversion unit.

5. The light-emitting element according to claim 1, wherein a molar ratio of $A^2/B^2$ is 0.95 to 1.05.

6. The light-emitting element according to claim 1, wherein W2 is the same as W1.

7. The light-emitting element according to claim 1, wherein W2 is different from W1.

8. The light-emitting element according to claim 1, wherein the ceramic containing $A^1B^1O_{w1}$ is a phosphor which emits first light having a center emission wavelength of 550 nm to 700 nm.

9. The light-emitting element according to claim 8, wherein the center emission wavelength is 600 nm to 700 nm.

10. The light-emitting element according to claim 8, wherein the ceramic containing $A^2B^2O_{w2}$ is a phosphor which emits second light having a center emission wavelength of 400 nm to 550 nm.

11. The light-emitting element according to claim 10, wherein the center emission wavelength of the first light is 600 nm to 700 nm and the center emission wavelength of the second light is 400 nm to 500 nm.

12. The light-emitting element according to claim 1, wherein the ceramic containing $A^2B^2O_{w2}$ is a phosphor which emits second light having a center emission wavelength of 400 nm to 550 nm.

13. The light-emitting element according to claim 12, wherein the center emission wavelength of the second light is 400 nm to 500 nm.

14. A light-emitting device comprising:
the light-emitting element according to claim 1; and
a light source which emits excitation light to the light-emitting element.

15. The light-emitting device according to claim 14, wherein the light-emitting element and the light source are spaced from each other.

16. The light-emitting device according to claim 14, wherein the light-emitting element and the light source are connected to each other.

* * * * *